United States Patent
Zhu et al.

(10) Patent No.: US 7,220,662 B2
(45) Date of Patent: May 22, 2007

(54) FULLY SILICIDED FIELD EFFECT TRANSISTORS

(75) Inventors: Huilong Zhu, Poughkeepsie, NY (US); Sunfei Fang, LaGrangeville, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 10/905,549

(22) Filed: Jan. 10, 2005

(65) Prior Publication Data

US 2006/0154461 A1   Jul. 13, 2006

(51) Int. Cl.
*H01L 21/3205* (2006.01)
(52) U.S. Cl. ................ 438/592; 438/655; 257/E21.203
(58) Field of Classification Search ................ 438/592, 438/655, 664, 945; 257/E21.203
See application file for complete search history.

(56) References Cited

U.S. PATENT DOCUMENTS

| 5,981,365 | A  | * | 11/1999 | Cheek et al. ................ 438/592 |
| 6,423,634 | B1 | * | 7/2002  | Wieczorek et al. ......... 438/655 |
| 6,555,453 | B1 |   | 4/2003  | Xiang et al. |
| 6,562,718 | B1 |   | 5/2003  | Xiang et al. |

* cited by examiner

*Primary Examiner*—Chandra Chaudhari
(74) *Attorney, Agent, or Firm*—Eric W. Petraske

(57) ABSTRACT

Fully silicided planar field effect transistors are formed by avoiding the conventional chemical-mechanical polishing step to expose the silicon gate by etching the sidewalls down to the silicon; depositing a sacrificial oxide layer thinner on the top of gate and sidewall of spacers, but thicker over the S/D areas, etching the oxide to expose the top of stacked gate while protecting the S/D; recessing the silicon; stripping the oxide; depositing metal and annealing to form silicide over the gate and S/D.

18 Claims, 10 Drawing Sheets

FULLY SILICIDED FIELD EFFECT TRANSISTORS

BACKGROUND OF THE INVENTION

The field of the invention is that of integrated circuit fabrication, in particular forming fully silicided field effect transistors without the use of CMP.

The field of integrated circuit fabrication has benefited greatly from the use of chemical-mechanical polishing (CMP), which has become part of the standard processing sequence.

The improved planarity provided by CMP has permitted the use of steppers with very high numerical apertures and with consequently very small depth of focus. In addition, the improved planarity has reduced defects caused by step height differences.

Quality standards have increased as time has passed and scratches and other defects caused by the CMP process have become a significant yield detractor.

One example is the variation in the height of the poly transistor gates, which cause variation in the quality of suicides formed on the gates and Vt scattering caused by the dopant snowplow effect.

In the course of a conventional process to fabricate a planar field effect transistor, the transistor structure of gate bracketed by sidewalls and embedded in the first level ILD is planarized with CMP to establish a plane at the level of the top of the gate so that the polysilicon gate can be silicided. Vertical conductors pass through this plane in order to establish contact between the electrodes of the transistors and higher level interconnect structures.

Grooves in the material that forms this plane can become filled with conductor material and establish short circuits.

The art could benefit from a method of forming a planar (silicided) field effect transistor that does not use CMP.

SUMMARY OF THE INVENTION

The invention relates to a method of forming a planar silicided field effect transistor that does not employ CMP.

A feature of the invention is the formation of an exposed silicon gate in the transistor without a CMP step.

Another feature of the invention is the recessing of the gate below the sidewalls for improved isolation.

DETAILED DESCRIPTION

Figure 10:
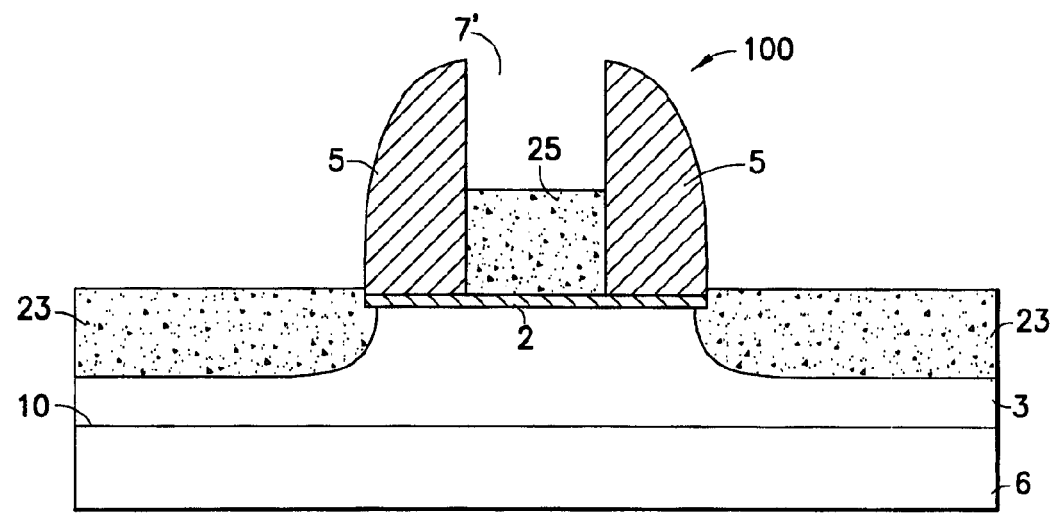

FIG. 10 illustrates a completed transistor structure according to the invention, in which a Field Effect Transistor (FET) denoted generally by the numeral 100, has been formed in semiconductor substrate 6. Substrate 6 has an upper layer 3, referred to as the device layer. Substrate 6 and device layer 3 are separated by line 10 that, in the case when the wafer is a silicon on insulator wafer, represents schematically the buried insulator.

Transistor 100, which may be a p-type (PFET) or n-type (NFET) device using appropriate doping, has the conventional elements of gate 25, gate dielectric 2, source/drain 23 and insulating sidewalls 5.

Substrate 6 may be silicon, Ge, SiGe or other semiconductor materials. Device layer 3 may be n-doped on p-doped and Si, Ge, SiGe, strained version of any of the foregoing, etc. Gate insulator 2 may be thermal oxide, oxynitride, high-k dielectrics, HfO2, etc.

Source/drain 23 and gate 25 are silicides such as CoSi2, NiSi, etc. Sidewalls 5 are nitride (Si3N4) or oxide (SiO2), silicon oxynitride or a combination thereof.

Those skilled in the art will readily be able to modify this list of materials to suit their needs.

Figure 1:
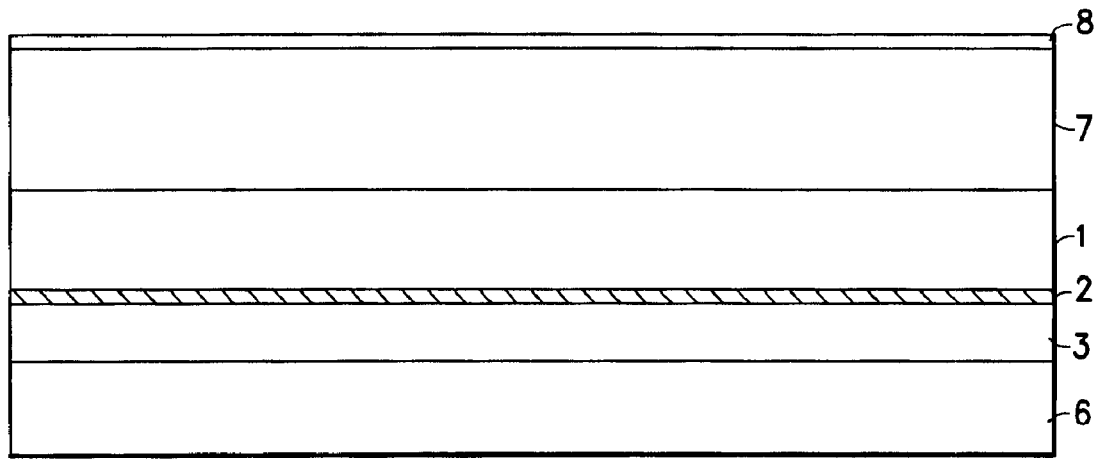
FIGS. 1–10 illustrate a first embodiment of the invention.

Referring to FIG. 1, a wafer having substrate 6, illustratively silicon, device layer 3, also silicon, gate dielectric 2, illustratively 0.5–4 nm of thermal oxide, a polycrystalline silicon (poly) gate layer 1 (10–50 nm) deposited over the gate dielectric and a stack height defining layer 7 (illustratively 80–120 nm) deposited over the gate layer.

Optionally, a hardmask layer 8, such as nitride, may be deposited to improve the etch quality of the subsequent gate stack etch, as is known in the art.

Figure 2:
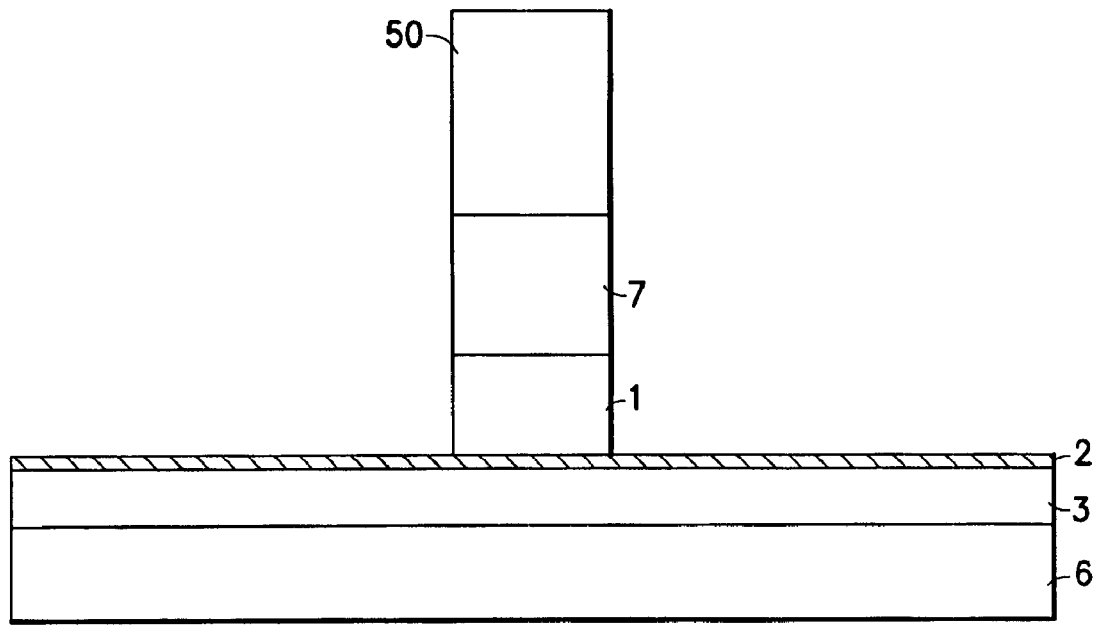

FIG. 2 shows the same area after patterning the gate stack. Photoresist 50 has been deposited, exposed and cured, after which the resist 50, poly-SiGe layer 7 and poly-Si layer 1 have been etched by a conventional directional reactive ion etch, stopping on gate dielectric 2. Optionally, a conventional threshold implant may be performed before the patterning of the resist. Layers 3 and 6 are not affected in this step.

Figure 3:
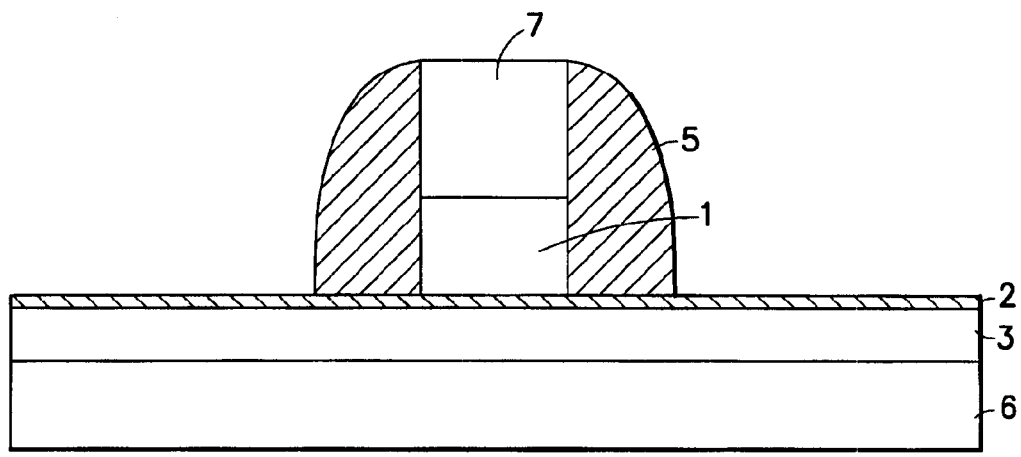

FIG. 3 shows the area after a step in which the resist is stripped and halo and extension implants into device layer 3 have been performed. Optionally, conventional steps of oxide thermal growth and/or oxide deposition may be performed in order to form desirable doping profiles for the implants and to prevent dopant out-diffusion. The implants are followed by a conventional spacer formation step in which 30–80 nm of nitride or another dielectric are deposited conformally and then subjected to a directional RIE that removes the dielectric on the top surface of the poly-SiGe and the gate dielectric, leaving standard nitride spacers 5. Layers 1, 2, 3 and 6 are not affected, except for the implants.

Figure 4:
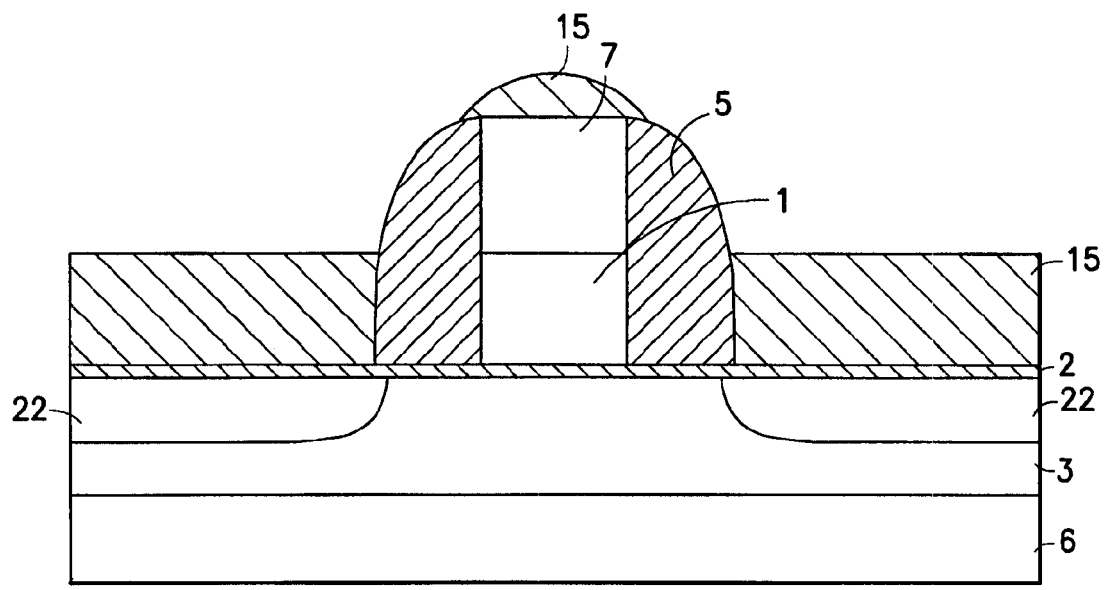

FIG. 4 shows the area after implantation of the source and drain 22 into layer 3 and deposition of oxide 15, illustratively by a high density plasma (HDP) process that forms a relatively thin layer of oxide on the top of layer 7 and sidewalls 5 and a relatively thick layer on the horizontal surface of gate dielectric 2 in the source and drain area. For convenience in the illustration, oxide 15 is shown as not being formed on the steep portion of layer 5. There may or may not be a thin layer of oxide in this area, depending on process fluctuations. Layers 1, 2, 5, 6 and 7 are not affected in this step.

Figure 5:
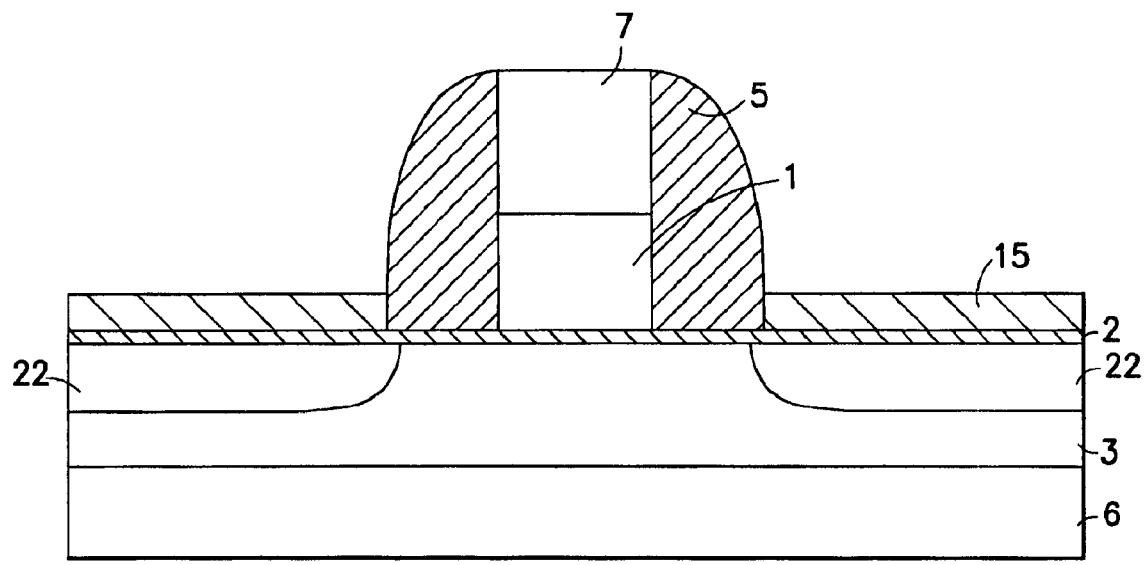

FIG. 5 shows the area after a wet etch in conventional dilute HF or isotropic plasma etch that removes oxide 15 from the upper surface of the gate stack and sidewalls, and removes only a portion of the oxide layer 15 in the source/drain area. The remaining oxide 15 serves to protect the source/drain area in the next step, so that the thickness of the remaining oxide should be sufficient to protect that area until the layer 7 is removed. Layers 1, 2, 3, 6 and 7 and S/D 22 are not affected by this step.

Figure 6:
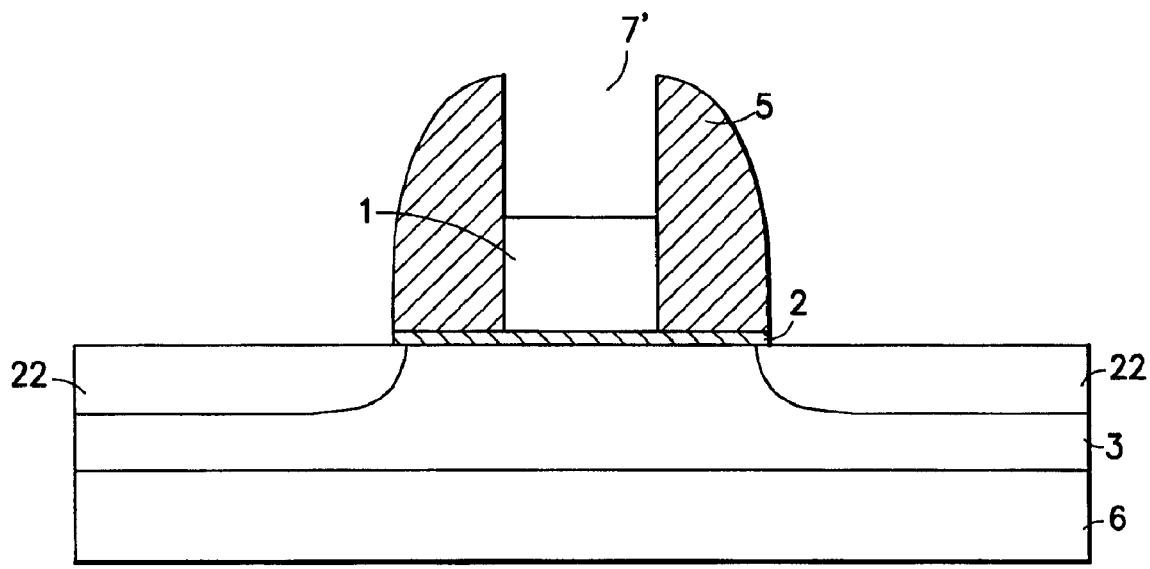

FIG. 6 shows the result of etching the SiGe layer 7 selective to poly-Si layer 1 using an etch such as a non-hydrogen containing etch gas mixture RIE chemistry, stopping on poly 1. The upper layer of the gate stack has been removed, leaving aperture 7'. The gate dielectric over the S/D area has also been removed. Layers 1, 3, 5 and 6 and S/D 22 are not affected by this step.

In a conventional process, the first level dielectric is deposited and planarized to the top level of the gate stack to expose the poly for siliciding.

That plane will be penetrated in the final structure by the source and drain (S/D) contacts. Scratches caused by the CMP may cause shorts between the gate and S/D contacts, since there are possible paths along the planarized surface.

In contrast, the present invention exposes the poly on top of the gate stack by etching the sidewalls, depositing and stripping a non-conformal oxide that protects the S/D areas when the poly is exposed.

In addition, the extra height in the gate stack permits the recessing of the gate electrode contact so that there is no direct path along a surface between the gate and the S/D.

Figure 7:
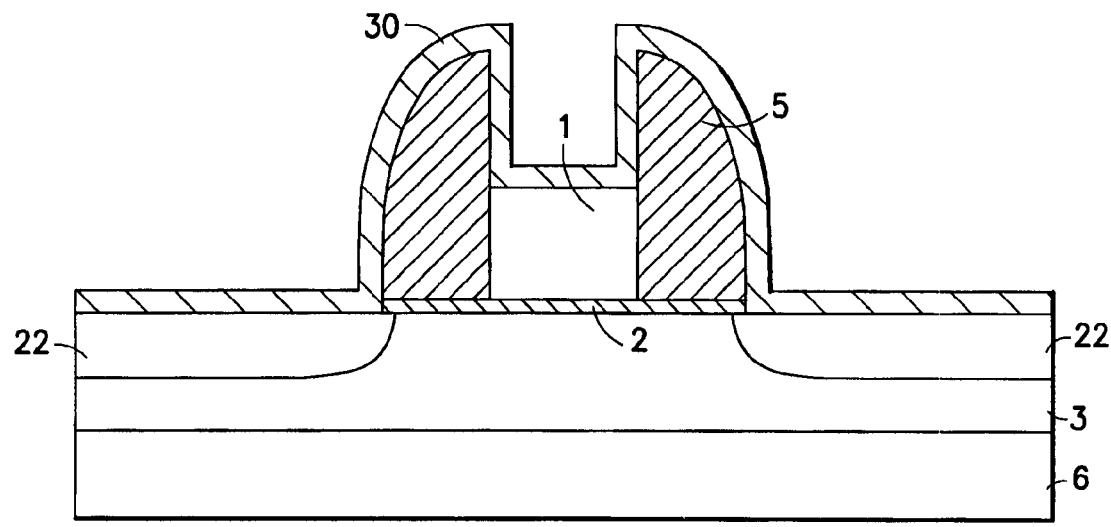

FIG. 7 shows the area after a step to remove oxide from the exposed silicon and the conformal deposition of a thin metal layer, illustratively 6–30 nm of nickel. Other refractory metals such as Ti, Pt, W, Co can be used. Layers 1, 2, 3 5 and 6 are not affected in this step.

Figure 8:
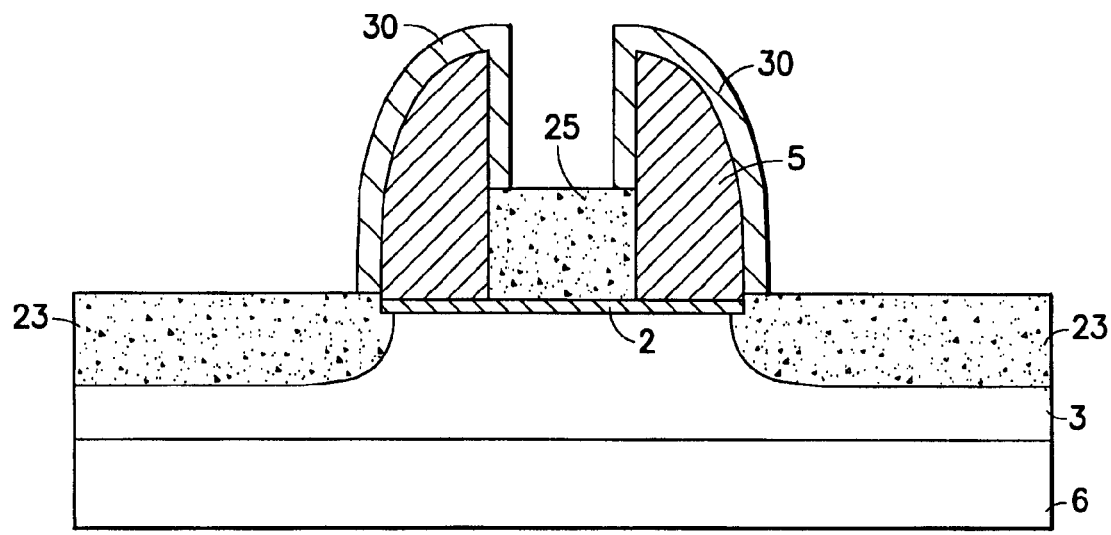

FIG. 8 shows the result of an annealing step (at 300–500 C) that forms a silicide (NiSi) with the poly 1 and the silicon in the S/D 22 in layer 3. The result is a fully silicided gate 25 and partially silicided S/D 23. The nickel adjacent to nitride 5 is not affected. Layers 2 and 6 are not affected in this step.

Figure 9:
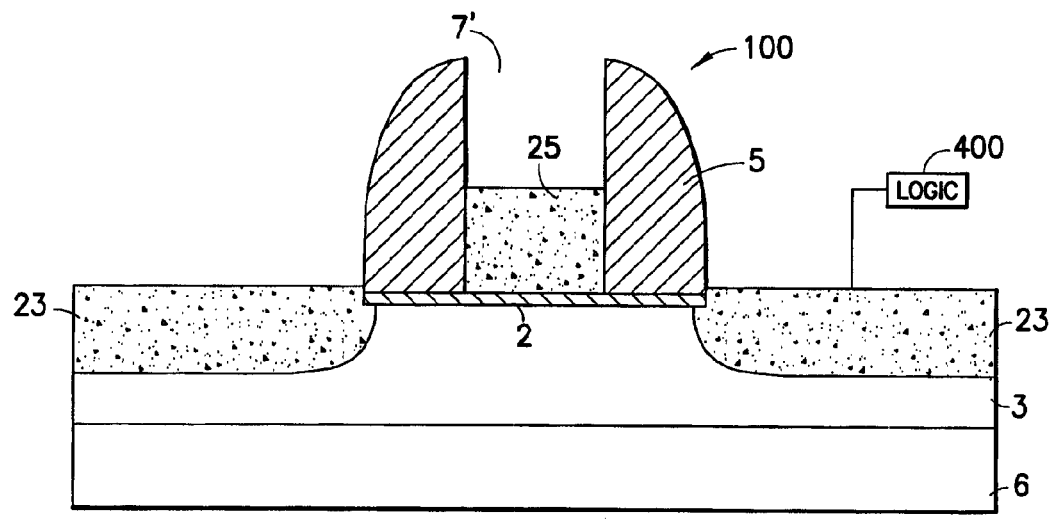

FIG. 9 shows the area after a step of removing the nickel 30 in a conventional wet etch such as an etchant comprising 20 parts H2O, 1 part H2O2 and 1 part HCl or equivalent.

The result is a functioning transistor 100 having a fully silicided gate 25 over gate dielectric 2 and between silicided S/D 23 in device layer 3 above substrate 6. Aperture 7' above gate 25 and isolated by sidewalls 5 is ready to receive a gate contact. S/D 23, isolated from the gate contact by sidewalls 25 is ready to receive source and drain contacts to connect this and other transistors to form an integrated circuit. For purposes of illustration, box 400 represents schematically the remainder of the integrated circuit that transistor 100 is a component of.

Conventional back end steps such as depositing interlevel dielectric (ILD), forming apertures though it to connect various transistors to make a circuit, etc. will be referred to as completing the circuit.

Figure 11:
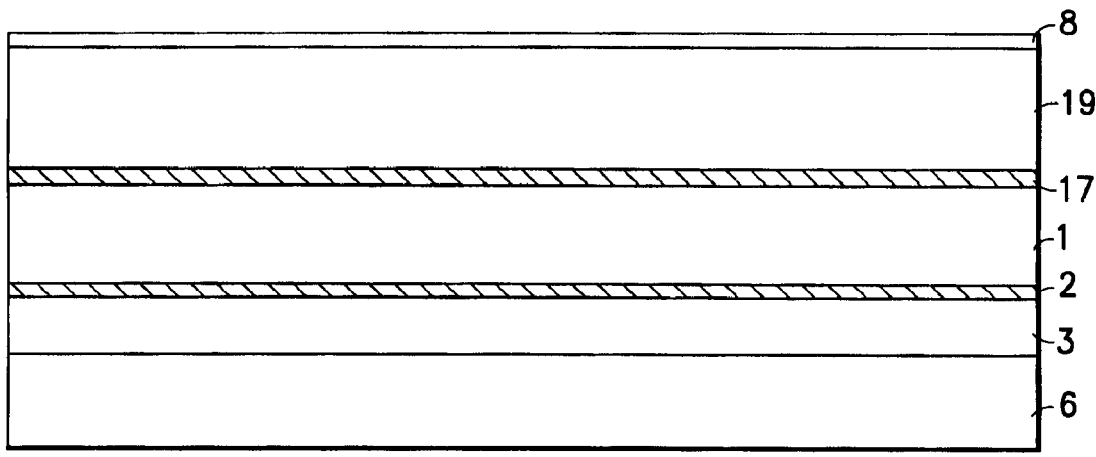
FIG. 11–19 illustrate an alternative embodiment of the invention.

A second embodiment of the invention is shown beginning with FIG. 11. A wafer having substrate 6, illustratively silicon, device layer 3, also silicon, gate dielectric 2, illustratively 0.5–4 nm of thermal oxide is shown. The deposited layers are different. A polycrystalline silicon (poly) gate layer 1 (10–50 nm) has been deposited over the gate dielectric. A second oxide layer 17 (5–10 nm) has been deposited and a stack height defining layer 19, illustratively 80–120 nm) has been deposited over the gate layer. In this embodiment, layer 19 is polycrystalline silicon, which is easier to deposit and cheaper than the SiGe layer in the first embodiment.

Optionally, a hardmask layer 8, such as nitride, may be deposited to improve the etch quality of the subsequent gate stack etch, as is known in the art.

Figure 12:
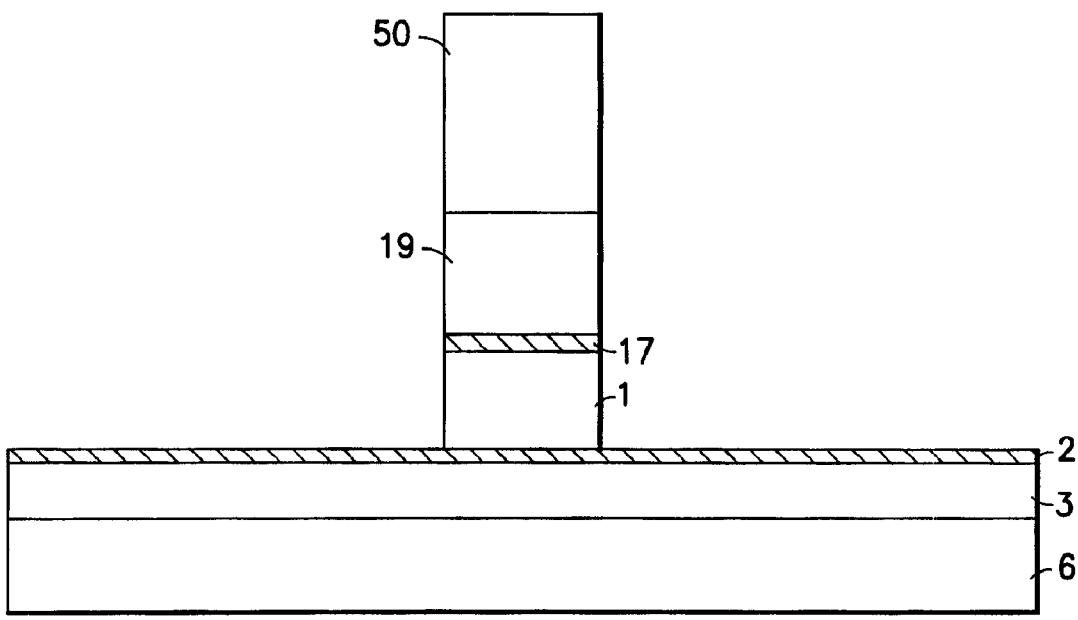

FIG. 12 shows the same area after patterning the gate stack. Photoresist 50 has been deposited, exposed and cured, after which the resist 50, poly-SiGe layer 19, second oxide 17 and poly-Si layer 1 have been etched by a conventional directional reactive ion etch, stopping on gate dielectric 2. Optionally, a conventional threshold implant may be performed before the patterning the resist. Layers 2, 3 and 6 are not affected in this step.

Figure 13:
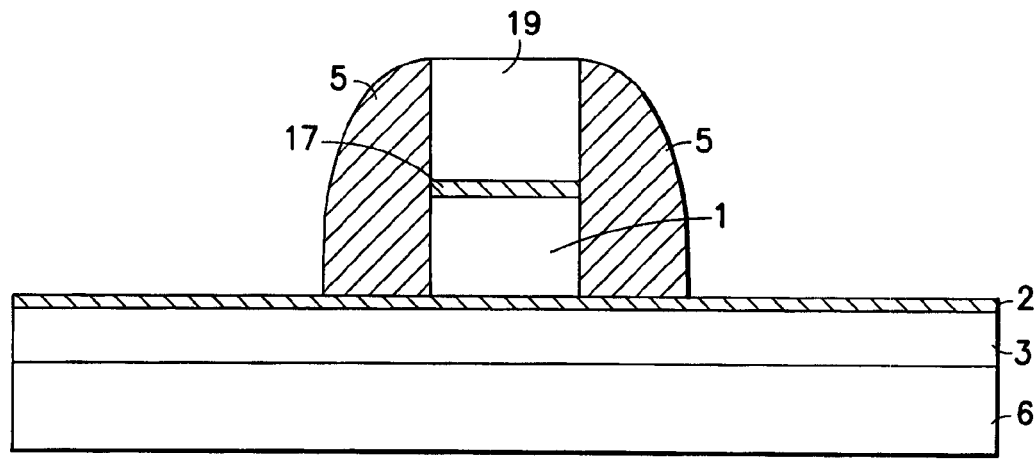

FIG. 13 shows the area after a step in which the resist is stripped and halo and extension implants into device layer 3 have been performed. Optionally, conventional steps of oxide thermal growth and/or oxide deposition may be performed in order to form desirable doping profiles for the implants and to prevent dopant out-diffusion. The implants are followed by a conventional spacer formation step in which 30–80 nm of nitride or another dielectric are deposited conformally and then subjected to a directional RIE that removes the dielectric on the top surface of the poly 19 and the gate dielectric, leaving standard nitride spacers 5. Layers 1, 2, 3 and 6 are not affected, except for the implants.

Figure 14:
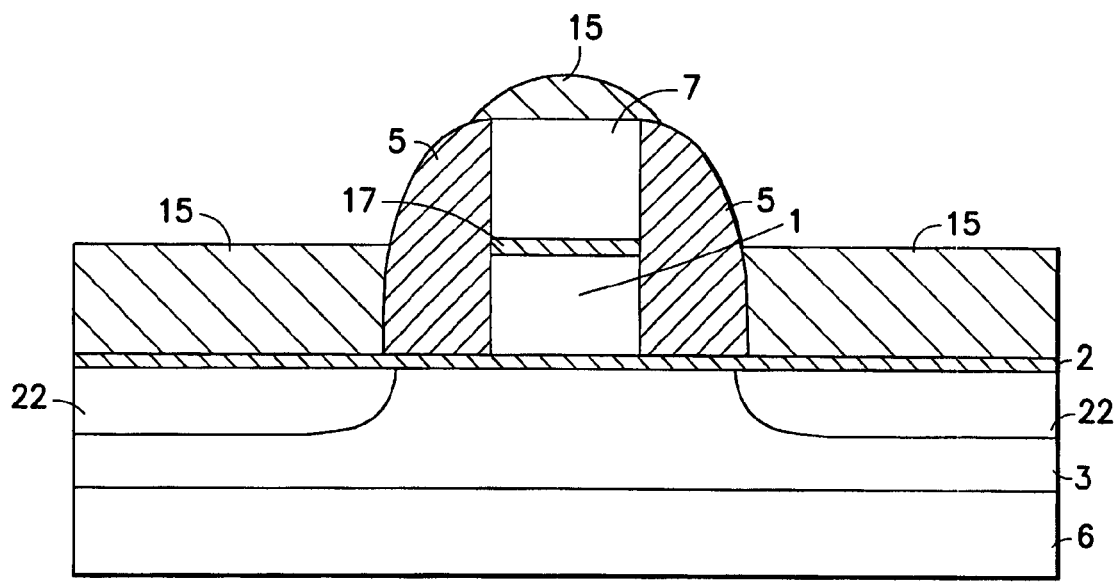

FIG. 14 shows the area after implantation of the source and drain 22 into layer 3 and deposition of oxide 15, illustratively by a high density plasma (HDP) process that forms a relatively thin layer of oxide 15 on the top of layer 19 and sidewalls 5 and a relatively thick layer on the horizontal surface of gate dielectric 2 in the source and drain area. For convenience in the illustration, oxide 15 is shown as not being formed on the steep portion of layer 5. There may or may not be a thin layer of oxide in this area, depending on process fluctuations. Layers 1, 2, 5, 6 and 19 are not affected in this step.

Figure 15:
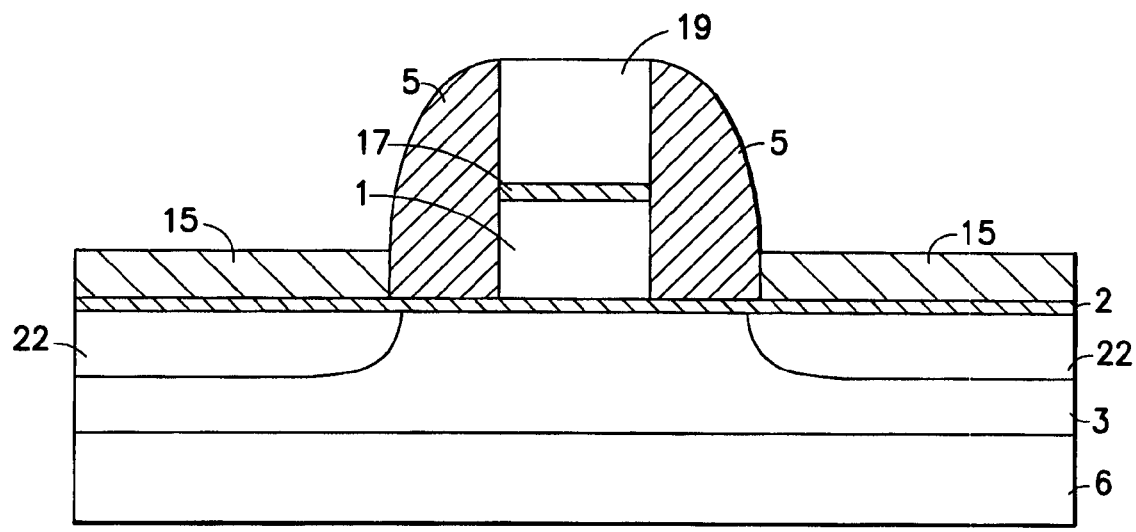

FIG. 15 shows the area after a wet etch in conventional HF chemistry that removes oxide 15 from the upper surface of the gate stack and sidewalls, and removes only a portion of the oxide layer 15 in the source/drain area. The remaining oxide 15 serves to protect the source/drain area in the next step, so that the thickness of the remaining oxide should be sufficient to protect that area until the layer 19 is removed. Layers 1, 2, 3, 6 and 19 and S/D 22 are not affected by this step.

Figure 16:
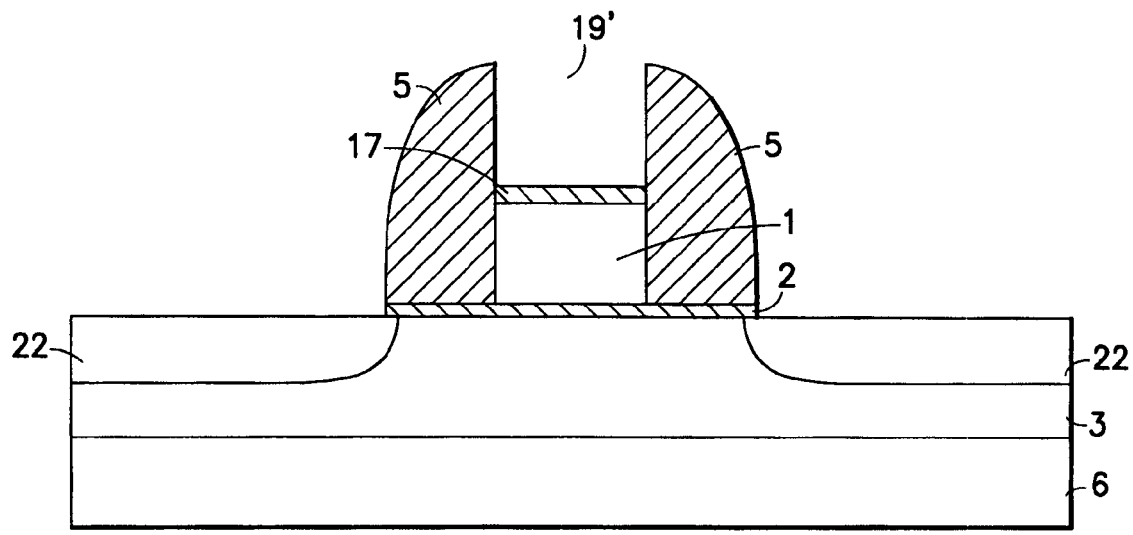

FIG. 16 shows the result of etching the layer 19 selective to oxide layer 15 using selective poly RIE chemistry, then removing the sacrificial oxide 15 and the separating oxide 17 selective to poly 1. The upper layer of the gate stack has been removed, leaving aperture 19'. The gate dielectric 2 over the S/D area has also been removed In a subsequent wet oxide etch. Layers 1, 3, 5 and 6 have not been affected in this step.

Figure 17:
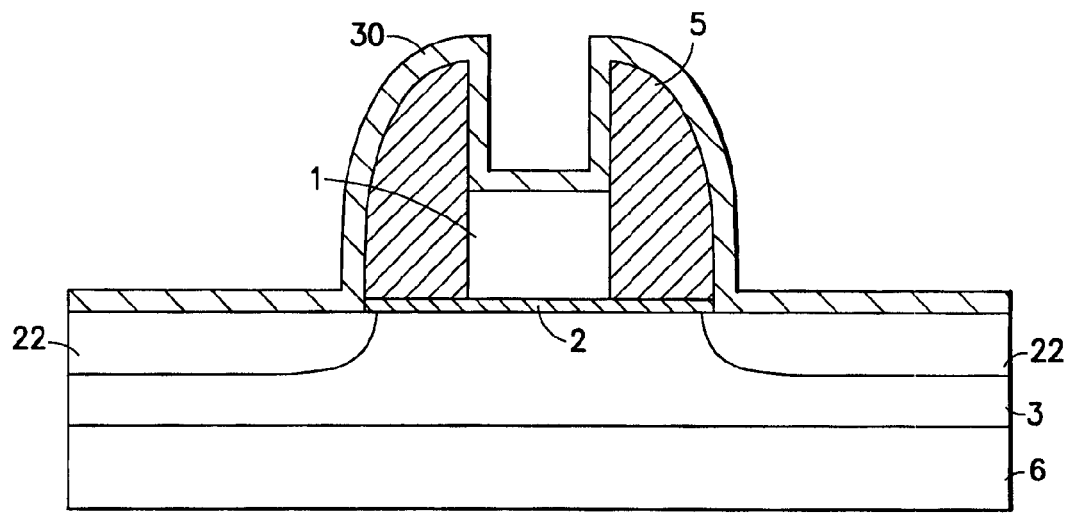

FIG. 17 shows the area after a pre-cleaning step to remove oxide from the exposed silicon and the conformal deposition of a thin metal layer 30, illustratively 6–30 nm of nickel. Other refractory metals such as Ti, Pt, W, Co can be used. Layers 1, 2, 3 5 and 6 are not affected in this step.

Figure 18:
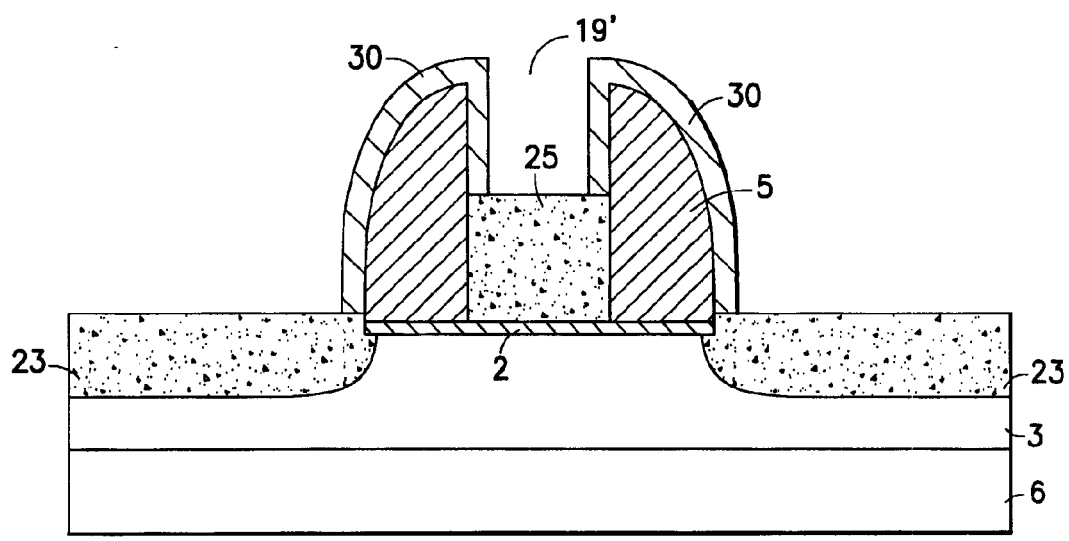

FIG. 18 shows the result of an annealing step at 300–500 C that forms a silicide (NiSi) with the poly 1 and the silicon in the S/D 22 in layer 3. The result is a fully silicided gate 25 and S/D 23. The nickel adjacent to nitride 5 is not affected. Layers 2 and 6 are not affected in this step.

Figure 19:
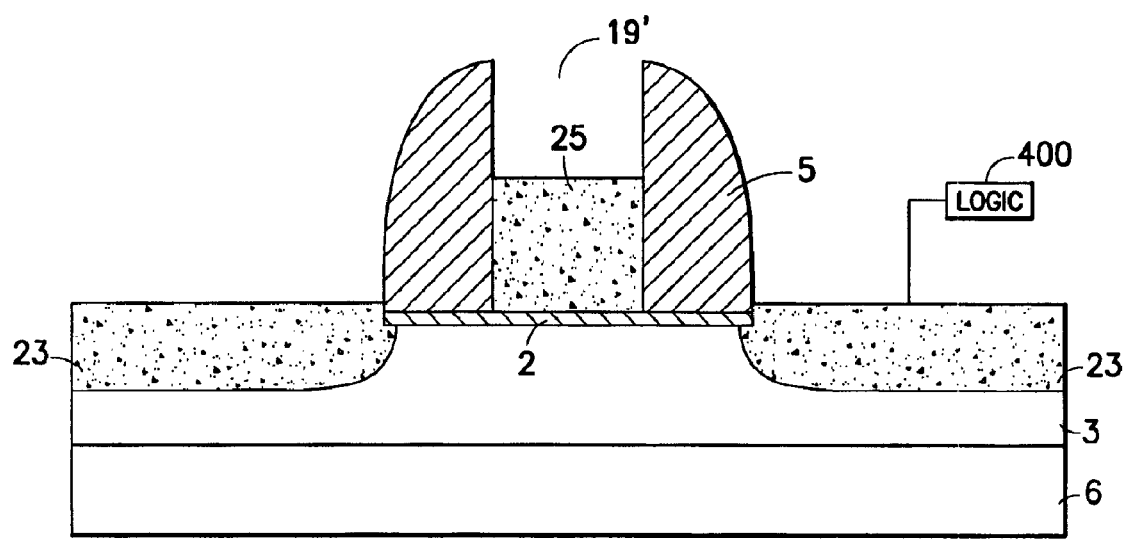

FIG. 19 shows the area after a step of removing the nickel 30 in a conventional wet etch. The result is a functioning transistor having a fully silicided gate 25 over gate dielectric 2 and between silicided S/D 23 in device layer 3 above substrate 6. Aperture 19' above gate 25 and isolated by sidewalls 5 is ready to receive a gate contact. S/D 23, isolated from the gate contact by sidewalls 25 is ready to receive source and drain contacts to connect this and other transistors to form an integrated circuit. For purposes of illustration, box 400 represents schematically the remainder of the integrated circuit that the transistor is a component of.

Conventional back end steps such as depositing interlevel dielectric (ILD), forming apertures though it to connect various transistors to make a circuit, etc. will be referred to as completing the circuit.

The process sequence is:
Provide a semiconductor wafer having a substrate and a device layer above the substrate.
Form a gate dielectric layer;

Form a gate layer;
Form a stack height layer (having different etch properties than gate);
Optional hard mask;
Deposit and pattern photoresist for gate stack, stopping on gate dielectric;
Halo and extension implants;
Form spacers;
Implant S/D;
Deposit sacrificial oxide;
Remove sacrificial oxide except over S/D;
Etch stack height layer selective to gate, stopping on gate layer and sacrificial oxide;
Remove sacrificial oxide over S/D;
Deposit conformal layer of refractory metal;
Anneal to form suicides on exposed silicon;
Strip surplus metal;
Back end processing The alternative embodiment process is:
Provide a semiconductor wafer having a substrate and a device layer above the substrate.
Form a gate dielectric layer;
Form a gate layer;
Form an oxide separation layer;
Form a stack height layer (having the same etch properties as gate);
Optional hard mask;
Deposit and pattern photoresist for gate stack, stopping on gate dielectric;
Halo and extension implants;
Form spacers;
Implant S/D;
Deposit sacrificial oxide;
Remove sacrificial oxide except over S/D;
Etch stack height layer, stopping on separation layer and sacrificial oxide;
Remove separation layer over gate and oxide over S/D;
Deposit conformal layer of refractory metal;
Anneal to form suicides on exposed silicon;
Strip surplus metal;
Back end processing While the invention has been described in terms of a single preferred embodiment, those skilled in the art will recognize that the invention can be practiced in various versions within the spirit and scope of the following claims.

What is claimed is:

1. A method of forming a silicided field effect transistor, comprising the steps of:
    Providing a semiconductor wafer having a substrate and a device layer above the substrate;
    Forming a gate dielectric layer;
    Forming a gate layer on said gate dielectric layer;
    Forming a stack height layer having different etch properties than said gate layer;
    Patterning a gate stack including said gate layer and said stack height layer, stopping on said gate dielectric;
    Forming sidewall spacers on said gate stack;
    Implanting a Source and Drain adjacent to said sidewall spacers;
    Depositing sacrificial oxide;
    Removing sacrificial oxide to expose said stack height layer, except over S/D;
    Etching said stack height layer selective to said gate layer, stopping on said gate layer and said sacrificial oxide;
    Removing said sacrificial oxide over S/D;
    Depositing a conformal layer of refractory metal;
    Annealing to form silicides on exposed silicon in gate and S/D; and
    Stripping surplus metal.

2. A method according to claim 1, in which said gate layer is polysilicon and said stack height layer is polycrystalline SiGe.

3. A method according to claim 1, in which said gate layer is polysilicon and said stack height layer is a composite layer of an etch stop layer of oxide and a layer of polysilicon above said layer of oxide.

4. A method according to claim 1, further comprising a step of depositing a hardmask layer above said stack height layer.

5. A method according to claim 1, further comprising a step of implanting halo and extension implants after said step of patterning said gate stack and before said step of forming sidewall spacers on said gate stack.

6. A method according to claim 2, further comprising a step of depositing a hardmask layer above said stack height layer.

7. A method according to claim 2, further comprising a step of implanting halo and extension implants after said step of patterning said gate stack and before said step of forming sidewall spacers on said gate stack.

8. A method according to claim 3, further comprising a step of depositing a hardmask layer above said stack height layer.

9. A method according to claim 3, further comprising a step of implanting halo and extension implants after said step of patterning said gate stack and before said step of forming sidewall spacers on said gate stack.

10. A method of forming an integrated circuit containing at least one silicided field effect transistor, comprising the steps of:
    Providing a semiconductor wafer having a substrate and a device layer above the substrate;
    Forming a gate dielectric layer;
    Forming a gate layer on said gate dielectric layer;
    Forming a separation layer having different etch properties than said gate layer forming a stack height layer;
    Patterning forming a stack height layer a gate stack including said gate layer, said separation layer and said stack height layer, stopping on said gate dielectric;
    Forming sidewall spacers on said gate stack;
    Implanting a Source and Drain adjacent to said sidewall spacers;
    Depositing sacrificial oxide;
    Removing sacrificial oxide to expose said stack height layer, except over S/D;
    Etching said stack height layer, stopping on said separation layer and said sacrificial oxide;
    Removing said separation layer over said gate and oxide over S/D;
    Depositing a conformal layer of refractory metal;
    Annealing to form suicides on exposed silicon in gate and S/D;
    Stripping surplus metal; and
    Completing said circuit.

11. A method according to claim 10, in which said gate layer is polysilicon and said stack height layer is polycrystalline SiGe.

12. A method according to claim 10, in which said gate layer is polysilicon and said stack height layer is a composite layer of an etch stop layer of oxide and a layer of polysilicon above said layer of oxide.

13. A method according to claim 10, further comprising a step of depositing a hardmask layer above said stack height layer.

14. A method according to claim 10, further comprising a step of implanting halo and extension implants after said step of patterning said gate stack and before said step of forming sidewall spacers on said gate stack.

15. A method according to claim 11, further comprising a step of depositing a hardmask layer above said stack height layer.

16. A method according to claim 11, further comprising a step of implanting halo and extension implants after said step of patterning said gate stack and before said step of forming sidewall spacers on said gate stack.

17. A method according to claim 12, further comprising a step of depositing a hardmask layer above said stack height layer.

18. A method according to claim 12, further comprising a step of implanting halo and extension implants after said step of patterning said gate stack and before said step of forming sidewall spacers on said gate stack.

* * * * *